(12) United States Patent
Sharma et al.

(10) Patent No.: US 9,785,368 B1
(45) Date of Patent: Oct. 10, 2017

(54) SYSTEM AND METHOD FOR MAPPING CONTROL AND USER DATA

(71) Applicant: FREESCALE SEMICONDUCTOR, INC., Austin, TX (US)

(72) Inventors: Ritika Sharma, Noida (IN); Somvir Dahiya, Bangalore (IN); Arvind Kaushik, Ghaziabad (IN); Amrit P. Singh, Ludhiana (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/218,053

(22) Filed: Jul. 24, 2016

(51) Int. Cl.
*G06F 3/06* (2006.01)
*H04W 8/22* (2009.01)

(52) U.S. Cl.
CPC .......... *G06F 3/0619* (2013.01); *G06F 3/0638* (2013.01); *G06F 3/0683* (2013.01); *H04W 8/22* (2013.01)

(58) Field of Classification Search
CPC .... G06F 3/0619; G06F 3/0638; G06F 3/0683; H04W 8/22
See application file for complete search history.

(56) References Cited

U.S. PATENT DOCUMENTS

| | | | |
|---|---|---|---|
| 5,601,658 A | 2/1997 | Marinas et al. | |
| 7,761,652 B2 * | 7/2010 | Kim | G06F 12/0246 711/103 |
| 8,032,788 B2 * | 10/2011 | Piacibello | G06F 8/60 714/23 |
| 8,266,500 B2 | 9/2012 | Kim et al. | |
| 8,341,340 B2 * | 12/2012 | Rub | G06F 12/0246 711/103 |
| 8,634,398 B2 | 1/2014 | Nam et al. | |
| 8,645,614 B2 * | 2/2014 | Jeong | G06F 12/0246 711/103 |
| 8,811,142 B2 | 8/2014 | Wang et al. | |
| 9,250,915 B2 * | 2/2016 | Jacobi | G06F 9/30043 |
| 9,432,608 B2 * | 8/2016 | Kim | G08C 17/02 |
| 9,501,731 B2 * | 11/2016 | Kolman | G06K 19/0724 |
| 2011/0310759 A1 | 12/2011 | Gerstenberger et al. | |
| 2012/0113827 A1 | 5/2012 | Yamada et al. | |
| 2014/0121966 A1 | 5/2014 | Iaccarino | |
| 2017/0139838 A1 * | 5/2017 | Tomlin | G06F 3/0611 |

* cited by examiner

*Primary Examiner* — Hiep Nguyen
(74) *Attorney, Agent, or Firm* — Charles E. Bergere

(57) ABSTRACT

A system for mapping control and user data includes a direction scanner, an address calculator, a collision detector, a buffer, and a mapper for mapping control and user data from a first memory to a second memory. The direction scanner determines the highest priority value of to a code word index. The address calculator calculates start and end addresses of the highest priority value. When an address from an address range, defined by the start and end addresses, is already mapped to other control data, the collision detector detects a collision and generates feedback data. The address calculator outputs modified start and end addresses based on the feedback data. When no collision is detected, the address calculator outputs the modified start and end addresses to the buffer. The mapper then maps the control and user data to the modified start and end addresses in the second memory.

14 Claims, 4 Drawing Sheets

SYSTEM AND METHOD FOR MAPPING CONTROL AND USER DATA

BACKGROUND

The present invention relates generally to communication systems, and, more particularly, to a system for mapping control and user data in a communication system.

Recent improvements in communication systems technology have led to the development of communication standards such as the third generation (3G) and fourth generation (4G) communication standards. The 4G standard is also referred to as the long-term evolution (LTE) standard. According to the LTE standard, a communication system includes an evolved Node B (eNode-B) and multiple user equipments (UEs). Examples of UEs include hand-held devices such as cellular phones, personal digital assistants (PDAs), and laptop computers with mobile broadband adapters. The UEs communicate with the eNode-B over uplink and downlink channels. The uplink channel includes a physical uplink channel, a logical uplink channel, and a transport uplink channel to transmit sets of control and user data from the multiple UEs to the eNode-B. The physical uplink channel includes either first and second dedicated channels for carrying the sets of control and user data, respectively, or a shared channel for carrying both sets of control and user data. The physical uplink channel also includes a physical uplink shared channel (PUSCH) to communicate the sets of control and user data from each of the multiple UEs to the eNode-B. The set of control data includes rank indicator (RI), channel quality information (CQI), hybrid automatic repeat requests (HARQ ACK/NACK), and code block data (CBD).

The eNode-B stores the sets of control and user data in a memory and processes the sets of control and user data in a predetermined sequence with a processor. The predetermined sequence is defined by the LTE standard based on first and second sets of priority values corresponding to the sets of control and user data, respectively. For example, first through fourth priority values are assigned to the RI, CQI, CBD, and HARQ ACK/NACK, respectively. The LTE standard defines the predetermined sequence to ensure that high priority control and user data are accurately processed with minimum delay, as compared to lower priority data.

Generally, the eNode-B receives the control and user data in the predetermined sequence. The memory stores the data in the predetermined sequence so that the processor can read and process the data in the predetermined sequence. However, the eNode-B may not always receive the data in the predetermined sequence due to delays such as processing delays, queuing delays, transmission delays, and propagation delays during the transmission of the data. In such a case, the memory stores the data in the sequence in which it is received. For example, the eNode-B receives and stores the RI and CQI at first and second addresses in the memory, respectively, so the processor then reads and processes the RI first, and then the CQI. However, if the eNode-B receives the CQI before the RI due to a delay in the transmission of the RI, then consequently the memory will store the RI and CQI at the second and first addresses, respectively, and the processor will mistakenly process the CQI as the RI and the RI as the CQI.

One way to ensure accurate processing of the control and user data is to map the control and user data to first and second sets of predetermined addresses, respectively, in the memory. The first and second sets of predetermined addresses are assigned to the control and user data based on corresponding first and second sets of priority values. Thus, the system maps the control and user data to the first and second sets of predetermined addresses, respectively, irrespective of the sequence in which they are received. However, several system clock cycles are needed to search the first and second sets of predetermined addresses in the memory while storing the data which introduces a delay in mapping the data to the predetermined addresses, and in turn processing the data, which is undesirable.

One way to overcome the aforementioned problems is to encode the control and user data, where the eNode-B system writes a set of encoded control data and a set of encoded user data at first and second sets of addresses, respectively, irrespective of the first and second sets of priority values corresponding to the sets of control and user data. The first and second sets of addresses each correspond to consecutive columns of a row of the memory. The system reads the encoded data from third and fourth sets of addresses, respectively. The third and fourth sets of addresses each correspond to consecutive rows of a column of the memory. The system reads the encoded data based on the corresponding first and second sets of priority values. Thus, the system avoids delay introduced for searching the first and second sets of predetermined addresses without compromising the accuracy of processing the sets of control and user data. However, the system fails to check whether other sets of encoded control and user data are already stored at the first and second sets of addresses. Although other sets of encoded data may already be stored at the first and second sets of addresses, the system may map the sets of encoded control and user data to the first and second sets of addresses, thus overwriting the already stored data with the set of encoded data at the first set of addresses, thereby corrupting the already stored set of encoded control data.

It would be advantageous to have a system that is able to quickly and accurately map the control and user data to the memory.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
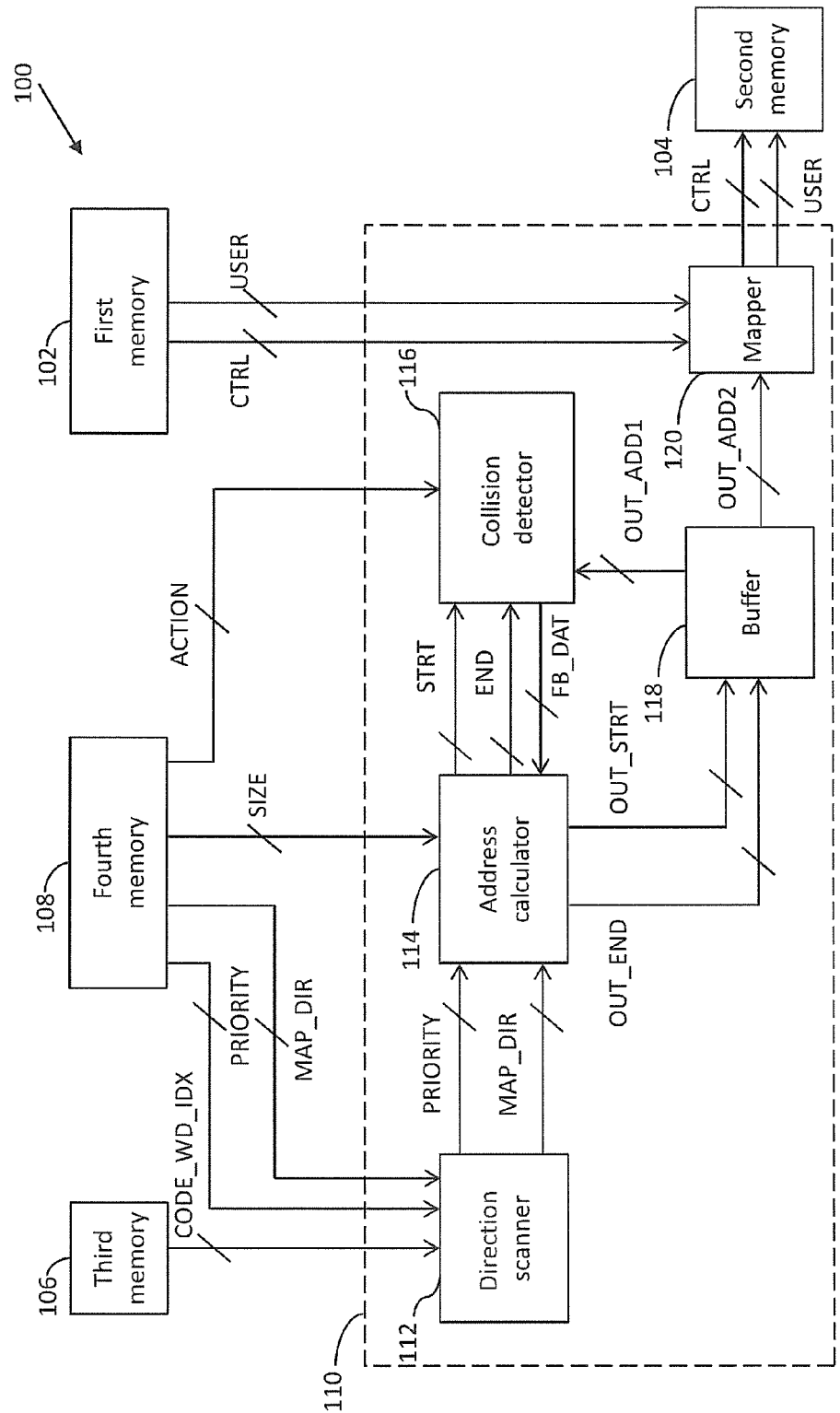
FIG. 1 is a schematic block diagram of a system that maps sets of control and user data to a memory in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention is a system that maps one of first control data and first user data, that is stored in a first memory, to a second memory. The system is connected to the first and second memories, as well as to third and fourth memories. The system includes a direction scanner, an address calculator, a collision detector, a buffer, and a mapper. The direction scanner receives a first code word index from the third memory and a set of priority values and first mapping direction data from the fourth memory based on the first code word index. The direction scanner compares each priority value of the set of priority values with a first maximum priority value and outputs a first priority value and the first mapping direction data based on the comparison of the priority values and the first maximum priority value. The direction scanner also modifies the first maximum priority value, generates a second maximum priority value, and outputs the second maximum priority value. The address calculator is connected to the direction scanner and receives the first priority value and the first mapping direction data. The address calculator also receives first size data from the fourth memory based on the first priority value, and first feedback data. The address calculator calculates first start and end addresses of the second memory based on the first size data and the first mapping direction data, modifies the first start and end addresses based on the first feedback data, and generates modified first start and end addresses. The address calculator outputs one of first output start and end addresses and the modified first start and end addresses. The address calculator outputs the modified first start and end addresses as start and end addresses, respectively. The collision detector is connected to the address calculator and receives the start and end addresses, receives first action data from the fourth memory, and receives a first set of output addresses. The collision detector calculates a first memory size corresponding to the second memory based on the first action data, the start and end addresses, and the first set of output addresses, and outputs the first feedback data based on the first memory size. The buffer is connected to the address calculator and stores the first set of output addresses. The buffer receives the first output start and end addresses, updates the first set of output addresses with the first output start and end addresses, and outputs a second set of output addresses. The mapper is connected to the first memory for receiving the one of the first control data and the first user data. The mapper also is connected to the buffer for receiving the second set of output addresses including the first output start and end addresses. The mapper stores the one of the first control data and the first user data in the second memory based on the first output start and end addresses.

In another embodiment, the present invention provides, in a system, a method to map at least one of first control data and first user data stored in a first memory to a second memory. The system is connected to the first and second memories, as well as to third and fourth memories. The method comprises receiving a first code word index from the third memory, and receiving a set of priority values and first mapping direction data from the fourth memory based on the first code word index. The method further comprises comparing each priority value of the set of priority values with a first maximum priority value. The method further comprises modifying the first maximum priority value and generating a second maximum priority value. The method further comprises outputting a first priority value of the set of priority values and the first mapping direction data based on the comparison of the set of priority values and the first maximum priority value. The method further comprises receiving first size data from the fourth memory based on the first priority value. The method further comprises calculating first start and end addresses that belong to the second memory based on the first size data and the first mapping direction data. The method further comprises modifying the first start and end addresses based on first feedback data. The method further comprises generating modified first start and end addresses as start and end addresses. The method further comprises receiving first action data from the fourth memory. The method further comprises calculating a first memory size corresponding to the second memory based on the first action data, the start and end addresses, and a first set of output addresses. The method further comprises outputting the first feedback data based on the first memory size, and outputting one of first output start and end addresses and the modified first start and end addresses. The modified first start and end addresses are output as start and end addresses, respectively. The method further comprises updating the first set of output addresses with the first output start and end addresses. The method further comprises outputting the first and second sets of output addresses, where the second set of output addresses includes the first output start and end addresses. The method further comprises receiving the one of the first control data and the first user data from the first memory, and storing the one of the first control data and the first user data in the second memory based on the first output start and end addresses.

Various embodiments of the present invention provide a system for mapping at least one of a set of control data and a set user data from a first memory to a second memory. The system is connected to third and fourth memories. The third memory stores a first code word index and a corresponding set of priority values including a first priority value. The fourth memory stores first mapping direction data, first size data, and first action data. The system includes a direction scanner, an address calculator, a collision detector, a buffer, and a mapper. The direction scanner compares a set of priority values with a maximum priority value, and outputs the first priority value and the first mapping direction data when the first priority value is equal to the maximum priority value. The address calculator calculates and outputs first start and end addresses as start and end addresses based on the first size data and the first mapping direction data. The collision detector determines a first address range from the first start address to the first end address. When a first address that is within the first address range is mapped to store another set of control data or another set of user data, the collision detector detects a collision. The collision detector receives action data and generates feedback data based on the action data. The address calculator outputs modified start and end addresses as the first start and end addresses, based on the feedback data, to the collision detector. When the collision detector detects no collisions, the address calculator outputs the modified start and end addresses to the buffer as first output start and end addresses, respectively. The buffer stores and outputs the first output start and end addresses. The mapper receives and stores the set of control data and the set of user data from the first memory to the first output start and end addresses in the second memory.

The long term evolution (LTE) standard assigns a set of priority values to the sets of control and user data. Thus, the LTE standard defines a predetermined sequence to process the sets of control data and user data. The system may receive the control and user data in a sequence that is not equal to the predetermined sequence. However, the system maps the sets of control and user data from the first memory to the second memory in the predetermined sequence. Thus, the system of the present invention ensures that the sets of control data and user data stored in the second memory are processed in the predetermined sequence. Further, the system calculates the set of addresses for mapping the sets of control and user data instead of predetermining a set of addresses to map the sets of control data and user data. Hence, the system does not consume a large number of clock cycles for searching the predetermined set of addresses and maps the set of control data and the set of user data without a delay. Further, the system includes the collision detector for detecting whether another control or user data is already stored at an address while mapping the sets of control data and user data to the address of the second memory. The system modifies the set of addresses and prevents corruption of the sets of control data and user data, and thereby accurately maps the sets of control data and user data in the order of the corresponding priority value.

A communication system includes an eNode-B and multiple user equipments (UEs). The multiple UEs transmit sets of control and user data CTRL and USER by way of the Long Term Evolution (LTE) standard-compliant Physical Uplink Shared Channel (PUSCH). The eNode-B includes a processor and an integrated circuit (IC), which receives the sets of control and user data CTRL and USER. The processor processes the control and user data CTRL and USER in a predetermined sequence, which is defined by the LTE standard.

FIG. 1 shows a schematic block diagram of the IC 100 including first through fourth memories 102-108 and a system 110 in accordance with an embodiment of the present invention. The system 110 includes a direction scanner 112, an address calculator 114, a collision detector 116, a buffer 118, and a mapper 120. The first memory 102 receives and stores the sets of control and user data CTRL and USER, which may not be in the predetermined sequence. The system 110 is connected to the first through fourth memories 102-108. The system 110 maps and stores the control and user data CTRL and USER from the first memory 102 to the second memory 104 in the predetermined sequence, and the processor, which is connected to the second memory 104, processes the control and user data CTRL and USER in the predetermined sequence.

In one embodiment, the eNode-B receives the set of control data CTRL including first and second control data CTRL1 and CTRL2, a corresponding first set of priority values including first and second priority values, and a corresponding first code word index CODE_WD_IDX1 from a first user of the multiple users. Similarly, the eNode-B receives the set of user data USER, a corresponding second set of priority values, and a corresponding second code word index CODE_WD_IDX2 from a second user of the multiple users. The third memory 106 stores first and second code word indices CODE_WD_IDX1 and CODE_WD_IDX2. In one embodiment, the third memory 106 is a first-in-first-out (FIFO) memory. Further, the third memory 106 receives the second code word index CODE_WD_IDX2 before the first code word index CODE_WD_IDX1. The third memory 106 outputs the second code word index CODE_WD_IDX2 before the first code word index CODE_WD_IDX1.

The system 110 receives and processes the second code word index CODE_WD_IDX2 before the first code word index CODE_WD_IDX1. Thus, the system 110 stores the set of user data USER before storing the set of control data CTRL in the second memory 104. Further, the system 110 stores the set of user data USER based on a first set of output addresses OUT_ADD1 in the second memory 104. The first set of output addresses OUT_ADD1 includes start and end addresses based on the predetermined sequence.

The LTE standard assigns the first and second sets of priority values to the set of control data CTRL and the set of user data USER, respectively, based on the predetermined sequence. The first set of priority values includes first and second priority values PRIORITY1 and PRIORITY2 assigned to the first and second control data CTRL1 and CTRL2, respectively. In one embodiment, the processor determines a first enable bit, a set of mapping direction data MAP_DIR, a set of size data SIZE, and a set of action data ACTION corresponding to the first set of priority values, based on the set of control data CTRL. The processor also determines a second enable bit corresponding to the second set of priority values. In another embodiment, the eNode-B receives the first enable bit, the set of mapping direction data MAP_DIR, the set of size data SIZE, and the set of action data ACTION corresponding to the first set of priority values from the first user. Similarly, the eNode-B receives the second enable bit corresponding to the second set of priority values from the second user. The first and second enable bits indicate whether the set of control data CTRL and set of user data USER are to be stored in the memory.

The set of mapping direction data MAP_DIR includes first and second mapping direction data MAP_DIR1 and MAP_DIR2 that correspond to the first and second control data CTRL1 and CTRL2, respectively. In the presently preferred embodiment, each of the first and second mapping direction data MAP_DIR1 and MAP_DIR2 indicate either a horizontal mapping direction or a vertical mapping direction. When the first mapping direction data MAP_DIR1 is the horizontal mapping direction, the first control data CTRL1 is mapped to corresponding consecutive columns in a row of the second memory 104. Similarly, when the second mapping direction data MAP_DIR2 is the horizontal mapping direction, the second control data CTRL2 is mapped to corresponding consecutive columns in a row of the second memory 104. When the first mapping direction data MAP_DIR1 is the vertical mapping direction, the first control data CTRL1 is mapped to corresponding consecutive rows in a column of the second memory 104. Similarly, when the second mapping direction data MAP_DIR2 is the vertical mapping direction, the second control data CTRL2 is mapped to corresponding consecutive rows in a column of the second memory 104.

The set of size data SIZE includes first and second size data SIZE1 and SIZE2 corresponding to the first and second control data CTRL1 and CTRL2, respectively. The first and second size data SIZE1 and SIZE2 indicate the sizes of the first and second control data CTRL1 and CTRL2, respectively. The set of action data ACTION includes first and second action data ACTION1 and ACTION2 corresponding to the first and second control data CTRL1 and CTRL2, respectively. Each of the first and second action data ACTION1 and ACTION2 indicate either a skip action or a discard action. When the first action data ACTION1 is the skip action, an address in the second memory 104 corresponding to the first control data CTRL1 is skipped and the first control data CTRL1 is mapped to a consecutive address. When the first action data ACTION1 is the discard action, the first control data CTRL1 corresponding to an address in the second memory 104 is discarded. Similarly, when the second action data ACTION2 is the skip action, an address in the second memory 104 corresponding to the second control data CTRL2 is skipped and the second control data CTRL2 is mapped to a consecutive address. When the second action data ACTION2 is the discard action, the second control data CTRL2 corresponding to an address in the second memory 104 is discarded.

The fourth memory 108 stores the first and second sets of priority values and the corresponding first and second enable bits. The fourth memory 108 also stores the first and second mapping direction data MAP_DIR1 and MAP_DIR2, the first and second size data SIZE1 and SIZE2, and the first and second action data ACTION1 and ACTION2.

The direction scanner 112 is connected to the third memory 106 to receive the first and second code word indices CODE_WD_IDX1 and CODE_WD_IDX2. Further, the direction scanner 112 is connected to the fourth memory 108 to receive the first and second enable bits, the first and second mapping direction data MAP_DIR1 and MAP_DIR2 and the first and second sets of priority values based on whether the first and second code word indices CODE_WD_IDX1 and CODE_WD_IDX2 are equal.

The address calculator 114 is connected to the direction scanner 112 to receive the first and second sets of priority values and the set of mapping direction data MAP_DIR. Further, the address calculator 114 is connected to the fourth memory 108 to receive the set of size data SIZE. The address calculator 114 outputs either start and end addresses STRT and END or output start and end addresses OUT_STRT and OUT_END based on the set of mapping direction MAP_DIR received by it.

The buffer 118 is connected to the address calculator 114 and receives the output start and end addresses OUT_STRT and OUT_END. In one embodiment, the buffer 118 initially stores no address and is empty. The buffer 118 receives and stores the output start and end addresses OUT_STRT and OUT_END. In another embodiment, the buffer 118 initially stores the first set of output addresses OUT_ADD1. The second memory 104 stores the set of user data USER at the first set of output addresses OUT_ADD1. The buffer 118 receives the output start and end addresses OUT_STRT and OUT_END and overwrites the first set of output addresses OUT_ADD1 with the output start and end addresses OUT_STRT and OUT_END. Thus, the buffer 118 stores a second set of output addresses OUT_ADD2. When the second set of output addresses OUT_ADD2 includes a set of output start and end addresses that correspond to the first set of priority values, the buffer 118 outputs the second set of output addresses OUT_ADD2.

The collision detector 116 is connected to the address calculator 114 for receiving the start and end addresses STRT and END and is also connected to the buffer 118. The collision detector 116 receives the start and end addresses STRT and END, and determines an address range based on the start address STRT and the end address END. When the buffer 118 initially stores the first set of output addresses OUT_ADD1, the collision detector 116 receives the first set of output addresses OUT_ADD1. The collision detector 116 compares each address of the address range with each address of the first set of output addresses OUT_ADD1. A first address of the first set of output addresses OUT_ADD1 may be equal to a first address of the address range. When the first address of the first set of output addresses OUT_ADD1 is equal to the first address of the address range, the collision detector 116 detects a collision at the first address in the second memory 104. In one embodiment, the collision detector 116 generates a handshake signal when the collision detector 116 detects at least one collision. The fourth memory 108 receives the handshake signal and outputs action data of the set of action data ACTION based on the handshake signal. Further, the collision detector 116 calculates a memory size which is equal to the size of the address range. The collision detector 116 outputs at least one feedback data FB_DAT, which indicates the memory size, the number of collisions, and the addresses corresponding to the collisions.

The mapper 120 is connected to the first memory 102 and the buffer 118 to receive the sets of control CTRL and user data USER and the second set of output addresses OUT_ADD2, respectively. Further, the mapper 120 stores the first and second control data CTRL1 and CTRL2 in the second memory 104, based on the second set of output addresses OUT_ADD2.

In operation, the direction scanner 112 receives the first code word index CODE_WD_IDX1 after the second code word index CODE_WD_IDX2 and compares the first code word index CODE_WD_IDX1 with the second code word index CODE_WD_IDX2. In one embodiment, the first and second code word indices CODE_WD_IDX1 and CODE_WD_IDX2 are received from the first and second users, respectively. Hence, the first and second code word indices CODE_WD_IDX1 and CODE_WD_IDX2 are not equal. When the first and second code word indices CODE_WD_IDX1 and CODE_WD_IDX2 are not equal, the direction scanner 112 receives the first enable bit, the first and second priority values PRIORITY1 and PRIORITY2 and the first and second mapping direction data MAP_DIR1 and MAP_DIR2. When the first enable bit is at a first logic state, it indicates that the set of control data CTRL is to be stored in the second memory 104. When the first enable bit is at a second logic state, it indicates that the set of control data CTRL is not to be stored in the second memory 104. Thus, the direction scanner 112 receives a third code word index CODE_WD_IDX3.

The direction scanner 112 compares each of the first and second priority values PRIORITY1 and PRIORITY2 with the first maximum priority value. In one embodiment, the first priority value PRIORITY1 equals the first maximum priority value. Hence, the direction scanner 112 outputs the first priority value PRIORITY1 and the first mapping direction data MAP_DIR1, decreases the first maximum priority value by one, and generates a second maximum priority value.

In another embodiment, the first and second code word indices CODE_WD_IDX1 and CODE_WD_IDX2 are received from the second user and a third code word index CODE_WD_IDX3 is received from the first user. Hence, the first and second code word indices CODE_WD_IDX1 and CODE_WD_IDX2 are equal. When the first and second code word indices CODE_WD_IDX1 and CODE_WD_IDX2 are equal the direction scanner 112 receives the third code word index CODE_WD_IDX3.

The address calculator 114 receives the first priority value PRIORITY1 and the first mapping direction data MAP_DIR1. Further, the address calculator 114 receives the first size data SIZE1 corresponding to the first priority value PRIORITY1. The address calculator 114 calculates first start and end addresses STRT1 and END1 in the second memory 104, based on the first mapping direction data MAP_DIR1 and the first size data SIZE1. The first start and end addresses STRT1 and END1 indicate that the first control data CTRL1 will be stored from the first start address STRT1 to the first end address END1 in the second memory 104. In one embodiment, since the set of user data USER, which corresponds to the second code word index CODE_WD_IDX2, is already stored in the second memory 104, the first start address STRT1 is consecutive to the last address at which the set of user data USER is stored. Hence, the address calculator 114 adds the first size data SIZE1 to the first start address STRT1 in the direction indicated by the first mapping direction data MAP_DIR1 and calculates the first end address END1.

When the first mapping direction data MAP_DIR1 indicates the horizontal mapping direction, the address calculator 114 outputs the first start and end addresses STRT1 and END1 as start and end addresses STRT and END. When the first mapping direction data MAP_DIR1 indicates the vertical mapping direction, the address calculator 114 outputs the first start and end addresses STRT1 and END1 as first output start and end addresses OUT_STRT1 and OUT_END1.

The collision detector 116 receives the first start and end addresses STRT1 and END1 and calculates a first address range. In one embodiment, when the buffer 118 initially stores no address, the second memory 104 has no data stored at addresses in the first address range. In another embodiment, when the buffer 118 initially stores the first set of output addresses OUT_ADD1, the collision detector 116 receives the first set of output addresses OUT_ADD1 and compares each address of the first address range with each address of the first set of output addresses OUT_ADD1. When no address of the first set of output addresses OUT_ADD1 is equal to any address within the first address range, the second memory 104 has no data stored at addresses in the first address range.

When the second memory 104 has no data stored at addresses in the first address range, the collision detector 116 detects no collision and calculates a first memory size that is equal to the size of the first address range. The collision detector 116 outputs first feedback data FB_DAT1, which includes the first memory size. The first feedback data FB_DAT1 indicates that the second memory 104 has no data stored at any address in the first address range.

When a first address of the first set of output addresses OUT_ADD1 is equal to a first address of the first address range, the collision detector 116 detects a collision at the first address and calculates a second memory size. Further, the collision detector 116 receives first action data ACTION1 of the set of action data ACTION corresponding to the first priority value PRIORITY1 from the fourth memory 108.

When the first action data ACTION1 indicates the discard action, the collision detector 116 does not map the first control data CTRL1 that corresponds to the first address, i.e., the collision detector 116 discards the first control data CTRL1. However, the first address range remains unchanged and the collision detector 116 calculates the first memory size which is equal to the size of the first address range. Thus, the collision detector 116 outputs second feedback data FB_DAT2 including the first memory size, one detected collision, and the first address at which the collision is detected.

When the first action data ACTION1 indicates the skip action, the collision detector 116 determines a second address in the first address range, which is consecutive to the first address. The collision detector 116 maps the first control data CTRL1 corresponding to the first address to the second address, i.e., the collision detector 116 skips the first address. Hence, the number of addresses in the first address range increases by one. The collision detector 116 increases the size of the first address range by one and calculates a second memory size which is equal to the first address range. The collision detector 116 generates third feedback data FB_DAT3 including the second memory size, one detected collision, and the first address at which the collision is detected.

When the first action data ACTION1 indicates the discard action, the address calculator 114 receives the second feedback data FB_DAT2. The address calculator 114 continues outputting the first start and end addresses STRT1 and END1.

When the first action data ACTION1 indicates the skip action, the address calculator 114 receives the third feedback data FB_DAT3. The address calculator 114 modifies the first start and end addresses STRT1 and END1, based on the third feedback data FB_DAT3, and generates the modified first start and end addresses MOD_STRT1 and MOD_END1. The collision detector 116 receives the modified first start and end addresses MOD_STRT1 and MOD_END1, determines the second address range, detects no collision within the second address range, and outputs the first feedback data FB_DAT1. The address calculator 114 receives the first feedback data FB_DAT1 and outputs the modified first start and end addresses MOD_STRT1 and MOD_END1 as the first output start and end addresses OUT_STRT1 and OUT_END1. The buffer 118 updates the first set of output addresses OUT_ADD1 with the first output start and end addresses OUT_STRT1 and OUT_END1, and stores the modified first set of addresses OUT_ADD1 as the second set of output addresses OUT_ADD2.

For example, the first set of output addresses OUT_ADD1 includes a first address 0010b, in the second memory 104, and the first start and end addresses STRT1 and END1 are 0001b and 0111b, respectively. The collision detector 116 receives the first action data ACTION1 as the skip action. The first address range from 0001b to 0111b includes a second address 0010b, which is equal to the first address. The collision detector 116 detects a collision at the second address 0010b. When each address corresponds to one byte of the second memory 104, the size of the second memory 104 corresponding to the first address range is 7 bytes. The collision detector 116 skips the address 0010b and maps the set of control data CTRL corresponding to the address 0010b at address 0011b. Hence, the collision detector 116 increases the first memory size by 1 byte. The collision detector 116 calculates the second memory size as 8 bytes and outputs the third feedback data FB_DAT3, which indicates 8 bytes, one collision detected, and the address 0010b. The address calculator 114 generates the modified first start address MOD_STRT1 as 0001b and the modified first end address MOD_END1 as 1000b, based on the third feedback data FB_DAT3.

The direction scanner 112 compares each priority value of the first set of priority values with the second maximum priority value. As the second priority value PRIORITY2 equals the second maximum priority value, the direction scanner 112 outputs the second priority value PRIORITY2 and the second mapping direction data MAP_DIR2 to the address calculator 114. The direction scanner 112 also decreases the second maximum priority value by one and generates a third maximum priority value. The address calculator 114 receives the second size data SIZE2 and calculates second start and end addresses STRT2 and END2. Since the second mapping direction data MAP_DIR2 corresponds to the vertical mapping direction, the address calculator 114 outputs the second start and end addresses STRT2 and END2 as the second output start and end addresses OUT_STRT2 and OUT_END2. The buffer 118 receives the second output start and end addresses OUT_STRT2 and OUT_END2.

The buffer 118 updates the second set of output addresses OUT_ADD2 with the second output start and end addresses OUT_STRT2 and OUT_END2. Further, the buffer 118 stores this modified second set of output addresses OUT_ADD2 as a third set of output addresses OUT_ADD3 and outputs the third set of output addresses OUT_ADD3. The mapper 120 receives the set of control data CTRL corresponding to the first code word index CODE_WD_IDX1 and maps it to the third set of output addresses OUT_ADD3 in the second memory 104.

The LTE standard defines the predetermined sequence for processing the sets of control and user data CTRL and USER. The IC 100 may receive the sets of control and user data CTRL and USER in a sequence that is not equal to the predetermined sequence. However, the system 110 maps the sets of control and user data CTRL and USER from the first memory 102 to the second memory 104 in the predetermined sequence. Thus, the system 110 ensures that the sets of control and user data CTRL and USER are processed in the predetermined sequence. Further, the system 110 calculates the set of addresses for mapping the set of control and user data CTRL and USER on-the-fly instead of storing a predetermined set of addresses for mapping the sets of control and user data CTRL and USER. Hence, the system 110 does not consume a large number of clock cycles for searching the predetermined set of addresses during the mapping of the sets of control and user data CTRL and USER. Moreover, the system 110 maps the sets of control and user data CTRL and USER without a delay. Further, the system 110 includes the collision detector 116 to detect whether another set of control data or user data is already stored at addresses while mapping the sets of control and user data CTRL and USER to the addresses of the second memory 104. If the second memory 104 has previously stored sets of control and user data, the system 110 modifies the set of addresses and prevents corruption of the sets of control and user data. Thus, the system 110 accurately maps the sets of control and user data CTRL and USER in the order of the corresponding priority value.

Figure 2A:
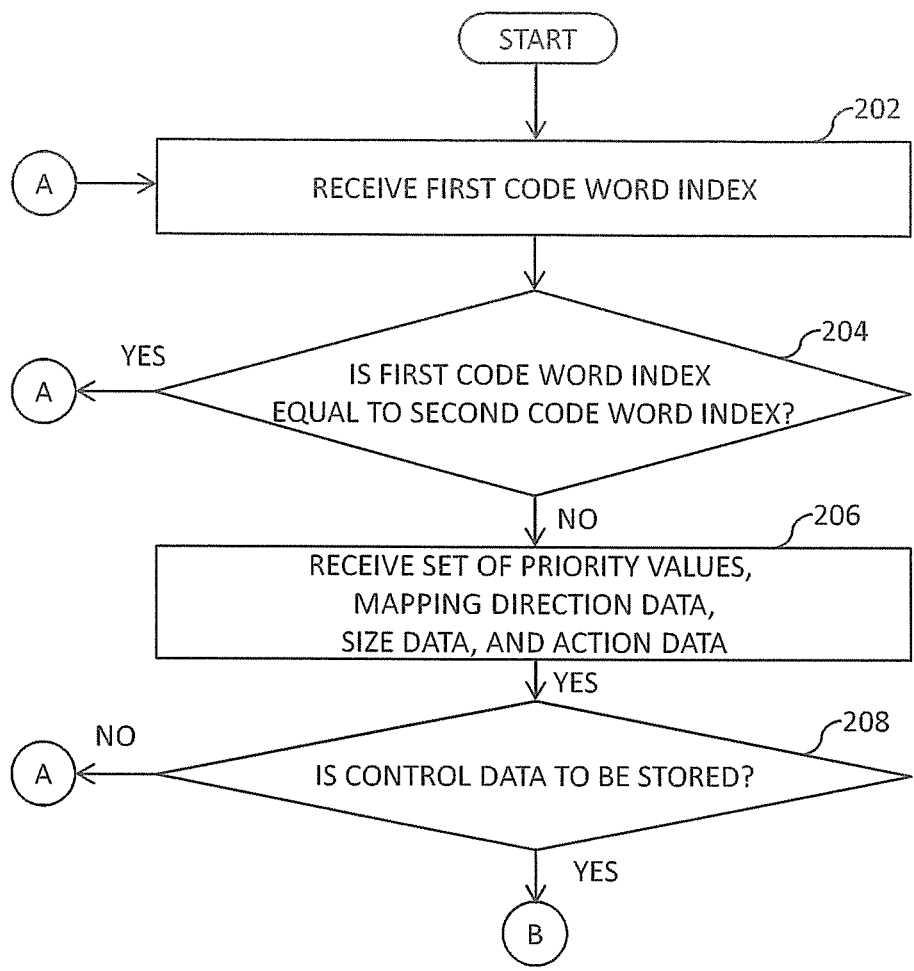
FIGS. 2A-2C are a flow chart illustrating a method for mapping sets of control and user data to a memory by the system of FIG. 1 in accordance with an embodiment of the present invention.
Figure 2B:
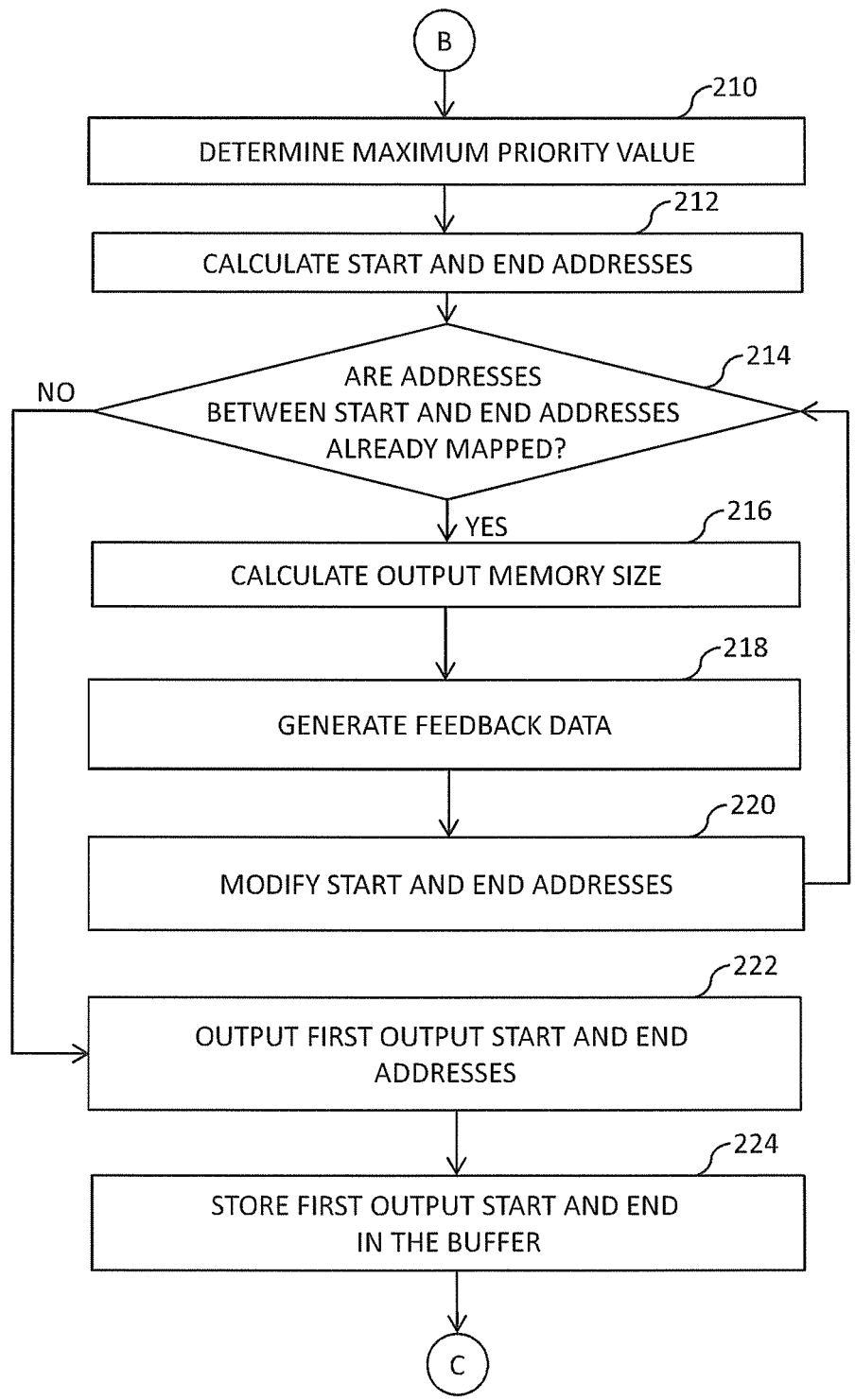
Figure 2C:
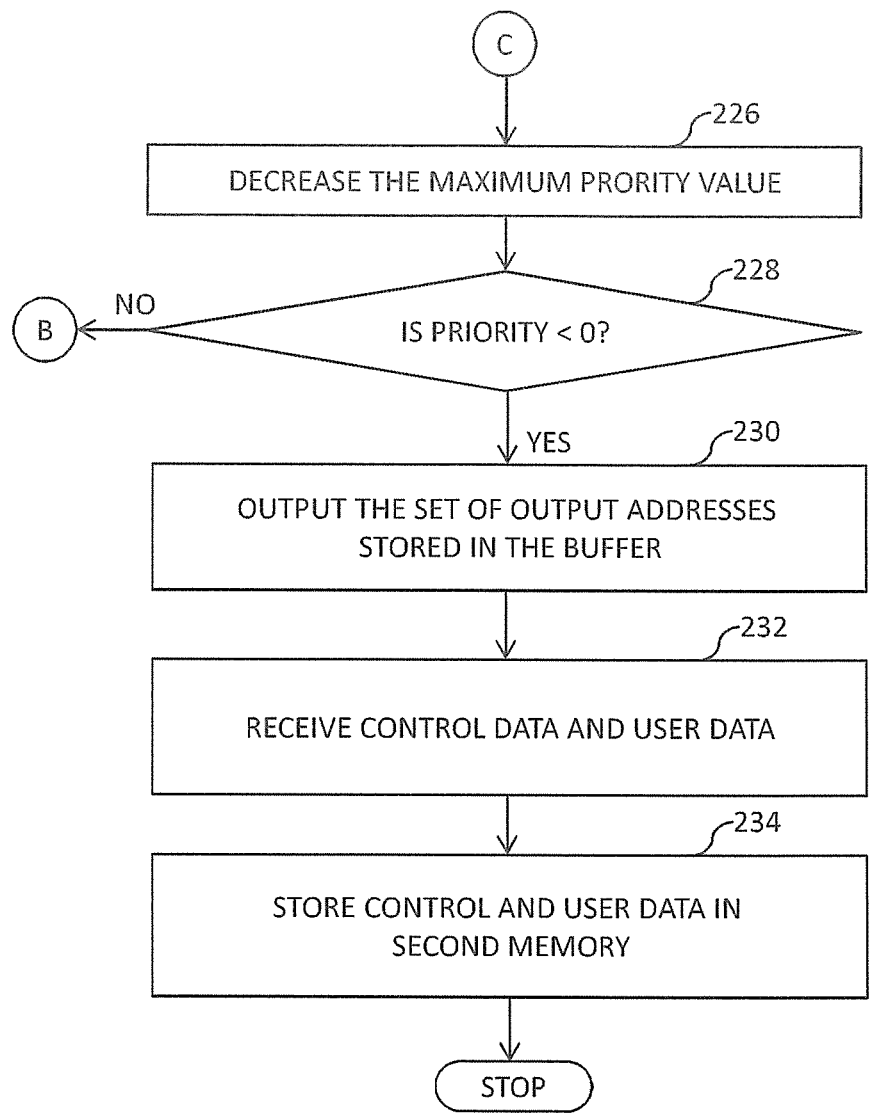

Referring now to FIGS. 2A-2C, a flow chart illustrating a method for mapping sets of control data CTRL and user data USER from the first memory 102 to the second memory 104 in accordance with an embodiment of the present invention is shown. At step 202, the direction scanner 112 receives the first code word index CODE_WD_IDX1 after receiving the second code word index CODE_WD_IDX2 from the third memory 106. At step 204, the direction scanner 112 compares the first code word index CODE_WD_IDX1 with the second code word index CODE_WD_IDX2. If the first code word index CODE_WD_IDX1 is not equal to the second code word index CODE_WD_IDX2, the direction scanner 112 executes step 206. At step 206, the direction scanner 112 receives the first and second priority values PRIORITY1 and PRIORITY2 and the first and second mapping direction data MAP_DIR1 and MAP_DIR2 from the fourth memory 108. The address calculator 114 receives the first and second size data SIZE1 and SIZE2 and the collision detector 116 receives the first and second action data ACTION1 and ACTION2 from the fourth memory 108. At step 208, the direction scanner 112 receives the first enable bit corresponding to the first code word index CODE_WD_IDX1 and checks whether the first enable bit is at the first logic state i.e. whether the set of control data CTRL is to be stored in the second memory 104.

When the direction scanner 112 receives the first enable bit at the first logic state, the set of control data CTRL is enabled and the direction scanner 112 executes step 210. At step 210, the direction scanner 112 compares each of the first and second priority values PRIORITY1 and PRIORITY2 with the first maximum priority value. In one embodiment, the first priority value PRIORITY1 equals the first maximum priority value. Hence, the direction scanner 112 outputs the first priority value PRIORITY1 and the first mapping direction data MAP_DIR1.

At step 212, the address calculator 114 calculates the first start and end addresses STRT1 and END1, based on the first size data SIZE1, the first priority value PRIORITY1, and the first mapping direction data MAP_DIR1, and outputs the first start and end addresses STRT1 and END1 as start and end addresses STRT and END. At step 214, the collision detector 116 determines whether at least one address within an address range from the start address STRT to the end address END is equal to an address of the set of output addresses received from the buffer 118. When at least one address within the address range is equal to an address of the set of output addresses, the system 110 executes steps 216 through 220. At step 216, the collision detector 116 calculates a memory size based on the number of collisions detected and the corresponding addresses at which the collisions are detected. At step 218, the collision detector 116 outputs the first feedback data FB_DAT1 to the address calculator 114. At step 220, the address calculator 114 modifies the first start and end addresses STRT1 and END1 and outputs the modified start and end addresses MOD_STRT1 and MOD_END1 as the start and end addresses STRT and END to the collision detector 116.

The system 110 then executes step 214. When no address within the address range is equal to an address of the set of output addresses, the collision detector 116 executes step 222. At step 222, the address calculator 114 outputs first output start and end addresses OUT_STRT1 and OUT_END1. At step 224, the buffer 118 stores the first output start and end addresses OUT_STRT1 and OUT_END1. At step 226, the direction scanner 112 decreases the first maximum priority value by one and generates the second maximum priority value. At step 228, the direction scanner 112 determines whether the second maximum priority value is less than zero. When the second maximum priority value is greater than zero, the direction scanner 112 executes the step 210 and generates a third maximum priority value. When the second maximum priority value is less than zero, the system 110 executes step 230. At step 230, the buffer 118 outputs the output start and end addresses OUT_STRT and OUT_END corresponding to each priority value of the first set of priority values to the mapper 120. At step 232, the mapper 120 receives the set of control data CTRL corresponding to each priority value of the first set of priority values from the first memory 102. At step 234, the mapper 120 stores the set of control data CTRL at the output start and end addresses OUT_STRT and OUT_END corresponding to each priority value of the first set of priority values in the second memory 104.

At step 204, when the first code word index CODE_WD_IDX1 is equal to the second code word index CODE_WD_IDX2, the system 110 executes step 202 and the direction scanner 112 receives the third code word index CODE_WD_IDX3 from the third memory 106. At step 208, when the direction scanner 112 receives the first enable bit at the second logic state, the system 110 executes step 202 and the direction scanner 112 receives the third code word index CODE_WD_IDX3 from the third memory 106.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for mapping at least one of first control data and first user data stored in a first memory, to a second memory, wherein the system is connected to the first and second memories and third and fourth memories, the system comprising:
   a direction scanner that (i) receives a first code word index from the third memory and a set of priority values and first mapping direction data from the fourth memory based on the first code word index, (ii) compares each priority value of the set of priority values with a first maximum priority value, (iii) modifies the first maximum priority value, (iv) generates a second maximum priority value, and (v) outputs a first priority value of the set of priority values and the first mapping direction data based on the comparison of the set of priority values and the first maximum priority value;
   an address calculator connected to the direction scanner for receiving (i) the first priority value and the first mapping direction data, (ii) first size data from the fourth memory based on the first priority value, and (iii) first feedback data, calculates first start and end addresses of the second memory based on the first size data and the first mapping direction data, modifies the first start and end addresses based on the first feedback data and generates modified first start and end addresses, and outputs one of first output start and end addresses and the modified first start and end addresses based on the first feedback data, wherein the address calculator outputs the modified first start and end addresses as start and end addresses, respectively;
   a collision detector connected to the address calculator for receiving the start and end addresses, wherein the collision detector receives first action data of a set of action data from the fourth memory, and a first set of output addresses, calculates a first memory size corresponding to the second memory based on the first action data, the start and end addresses, and the first set of output addresses, and outputs the first feedback data based on the first memory size;
   a buffer, connected to the address calculator, that stores the first set of output addresses, receives the first output start and end addresses, updates the first set of output addresses with the first output start and end addresses, and outputs a second set of output addresses; and
   a mapper that receives the one of the first control data and the first user data output from the first memory, is connected to the buffer for receiving the second set of output addresses including the first output start and end addresses, and stores the at least one of the first control data and the first user data in the second memory based on the first output start and end addresses.

2. The system of claim 1, wherein the direction scanner (i) receives a second code word index from the third memory before the first code word index, (ii) compares the first code word index with the second code word index, and (iii) receives the set of priority values, the first mapping direction data based on the comparison of the first and second code word indices, wherein the third memory is a first-in-first-out (FIFO) memory.

3. The system of claim 1, wherein the direction scanner further:
   receives second mapping direction data from the fourth memory,
   compares each priority value of the set of priority values with the second maximum priority value,
   modifies the second maximum priority value,
   generates a third maximum priority value, and
   outputs a second priority value of the set of priority values and the second mapping direction data based on the comparison of the set of priority values and the second maximum priority value, wherein the first memory further stores at least one of second control data and second user data.

4. The system of claim 3, wherein the address calculator:
   receives second size data from the fourth memory based on the second priority value,
   receives second feedback data, the second priority value, and second mapping direction data,
   calculates second start and end addresses of the second memory based on the second size data and the second mapping direction data,
   modifies the second start and end addresses based on the second feedback data and generates modified second start and end addresses, and
   outputs one of second output start and end addresses and the modified second start and end addresses based on the second feedback data, wherein the address calculator outputs the modified second start and end addresses as the start and end addresses, respectively.

5. The system of claim 4, wherein the collision detector (i) receives the second set of output addresses, second action data of the set of action data, and the start and end addresses, (ii) calculates a second memory size of the second memory based on the second action data, the start and end addresses, and the second set of output addresses, and (iii) outputs the second feedback data based on the second memory size.

6. The system of claim 5, wherein the buffer (i) receives the second output start and end addresses, (ii) updates the second set of output addresses with the second output start and end addresses, and (iii) outputs a third set of output addresses.

7. The system of claim 6, wherein the mapper (i) receives the third set of output addresses including the second output start and end addresses, and the one of the second control data and the second user data and (ii) stores the one of the second control data and the second user data in the second memory based on the second output start and end addresses.

8. A method for mapping at least one of first control data and first user data, that is stored in a first memory, to a second memory by a system, wherein the system is connected to the first and second memories and third and fourth memories, the method comprising:
   receiving a first code word index from the third memory;
   receiving a set of priority values and first mapping direction data from the fourth memory based on the first code word index;
   comparing each priority value of the set of priority values with a first maximum priority value;
   modifying the first maximum priority value and generating a second maximum priority value;
   outputting a first priority value of the set of priority values and the first mapping direction data based on the comparison of the set of priority values and the first maximum priority value;
   receiving first size data from the fourth memory based on the first priority value;
   calculating first start and end addresses of the second memory based on the first size data and the first mapping direction data;

modifying the first start and end addresses based on first feedback data;
generating modified first start and end addresses as start and end addresses, respectively;
receiving first action data from the fourth memory;
calculating a first memory size corresponding to the second memory based on the first action data, the start and end addresses, and a first set of output addresses;
outputting the first feedback data based on the first memory size;
outputting at least one of first output start and end addresses and the modified first start and end addresses based on the first feedback data, wherein the modified first start and end addresses are outputted as start and end addresses, respectively;
updating the first set of output addresses with the first output start and end addresses;
outputting a second set of output addresses, wherein the second set of output addresses includes the first output start and end addresses;
receiving the at least one of the first control data and the first user data from the first memory; and
storing the at least one of the first control data and the first user data in the second memory based on the first output start and end addresses.

9. The method of claim 8, further comprising:
receiving a second code word index from the third memory, wherein the third memory is a first-in-first-out (FIFO) memory;
comparing the first code word index with the second code word index; and
receiving the set of priority values and the first mapping direction data based on the comparison of the first and second code word indices.

10. The method of claim 8, further comprising:
receiving second mapping direction data from the fourth memory;
comparing each priority value of the set of priority values with the second maximum priority value;
modifying the second maximum priority value;
generating a third maximum priority value; and
outputting a second priority value of the set of priority values and the second mapping direction data based on the comparison of the set of priority values and the second maximum priority value, wherein the first memory further stores at least one of second control data and second user data.

11. The method of claim 10, further comprising:
receiving second size data from the fourth memory based on the second priority value;
receiving second feedback data;
calculating second start and end addresses of the second memory based on the second size data and the second mapping direction data;
modifying the second start and end addresses based on the second feedback data;
generating modified second start and end addresses; and
outputting at least one of second output start and end addresses and the modified second start and end addresses based on the second feedback data, wherein the modified second start and end addresses are outputted as the start and end addresses, respectively.

12. The method of claim 11, further comprising:
receiving second action data from the fourth memory and the second set of output addresses;
calculating a second memory size of the second memory based on the second action data, the start and end addresses, and the second set of output addresses; and
outputting the second feedback data based on the second memory size.

13. The method of claim 12, further comprising:
updating the second set of output addresses with the second output start and end addresses; and
outputting a third set of output addresses.

14. The method of claim 13, further comprising:
receiving the at least one of the second control data and the second user data from the first memory; and
storing the at least one of the second control data and the second user data in the second memory based on the second output start and end addresses.

* * * * *